(12) United States Patent
Cui et al.

(10) Patent No.: US 11,260,495 B2
(45) Date of Patent: Mar. 1, 2022

(54) APPARATUS AND METHODS FOR CHEMICAL MECHANICAL POLISHING

(71) Applicant: TAIWAN SEMICONDUCTOR MANUFACTURING COMPANY LTD., Hsinchu (TW)

(72) Inventors: Ji James Cui, Hsinchu (TW); Feng Yuan Hsu, Yilan County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 650 days.

(21) Appl. No.: 16/162,178

(22) Filed: Oct. 16, 2018

(65) Prior Publication Data
US 2020/0030933 A1  Jan. 30, 2020

Related U.S. Application Data

(60) Provisional application No. 62/711,021, filed on Jul. 27, 2018.

(51) Int. Cl.
| | | |
|---|---|---|
| *B24B 37/013* | (2012.01) | |
| *H01L 21/67* | (2006.01) | |
| *B24B 49/12* | (2006.01) | |
| *B24B 37/26* | (2012.01) | |

(Continued)

(52) U.S. Cl.
CPC ............ *B24B 37/013* (2013.01); *B24B 37/22* (2013.01); *B24B 37/24* (2013.01); *B24B 37/26* (2013.01); *B24B 49/12* (2013.01); *H01L 21/67253* (2013.01)

(58) Field of Classification Search
CPC ....... B24B 37/013; B24B 37/22; B24B 37/24; B24B 37/26; B24B 49/12
See application file for complete search history.

(56) References Cited

U.S. PATENT DOCUMENTS

| | | | | |
|---|---|---|---|---|
| 5,698,455 A | * | 12/1997 | Meikle | B24B 37/24 |
| | | | | 438/8 |
| 6,036,579 A | * | 3/2000 | Cook | B24B 37/22 |
| | | | | 451/36 |

(Continued)

FOREIGN PATENT DOCUMENTS

| | | |
|---|---|---|
| CN | 1252336 A | 5/2000 |
| CN | 101266915 | 9/2008 |

(Continued)

OTHER PUBLICATIONS

"Photo-diode." Media To Get Blog. Sep. 9, 2011. <https://mediatoget.blogspot.com/2011/09/photo-diode.html>. (Year: 2011).*

(Continued)

*Primary Examiner* — Joel D Crandall
(74) *Attorney, Agent, or Firm* — WPAT, P.C., Intellectual Property Attorneys; Anthony King

(57) ABSTRACT

A polishing pad for CMP is provided. The polishing pad includes a layer of material having a surface, a plurality of grooves indented into the surface in the layer of material, and a fluorescent indicator in the layer of material. Each of the plurality of grooves has a first depth, the fluorescent indicator has a second depth, and the second depth is equal to or less than the first depth.

20 Claims, 15 Drawing Sheets

(51) Int. Cl.
*B24B 37/24* (2012.01)
*B24B 37/22* (2012.01)

(56) References Cited

U.S. PATENT DOCUMENTS

| | | | |
|---|---|---|---|
| 6,106,661 A * | 8/2000 | Raeder | B24B 37/26 |
| | | | 156/345.12 |
| 6,466,642 B1 | 10/2002 | Meloni | |
| 9,165,778 B2 | 10/2015 | Liu | |
| 9,305,851 B2 | 4/2016 | Liu et al. | |
| 2002/0083577 A1* | 7/2002 | Suzuki | B24B 37/26 |
| | | | 29/603.16 |
| 2010/0233590 A1 | 9/2010 | Ryu | |
| 2011/0138951 A1 | 6/2011 | Mashue et al. | |
| 2011/0143539 A1 | 6/2011 | Bajaj et al. | |
| 2012/0301724 A1* | 11/2012 | Frauenrath | G02F 1/0063 |
| | | | 428/411.1 |
| 2013/0237136 A1 | 9/2013 | Newell et al. | |
| 2015/0162209 A1 | 6/2015 | Liu | |
| 2015/0343852 A1 | 12/2015 | Joza | |
| 2017/0157733 A1* | 6/2017 | Shi | B24B 37/22 |
| 2019/0224811 A1 | 7/2019 | Guzman et al. | |

FOREIGN PATENT DOCUMENTS

| | | | |
|---|---|---|---|
| CN | 101266915 | A | 9/2008 |
| CN | 102418677 | A | 4/2012 |
| CN | 103029035 | A | 4/2013 |
| CN | 103222034 | A | 7/2013 |
| CN | 104903123 | A | 9/2015 |
| CN | 106808359 | A | 6/2017 |
| CN | 109794849 | A | 5/2019 |
| JP | 2008-307659 | A | 12/2008 |
| KR | 20000003353 | | 1/2000 |
| KR | 20150057961 | | 5/2015 |
| TW | 201922420 | A | 6/2019 |

OTHER PUBLICATIONS

Office Action and Search Report dated Mar. 3, 2021 issued by China Intellectual Property Office for counterpart application No. 201910505972.9.
English abstract of CN1252336A.
Office Action and Search Report dated May 19, 2020 issued by Taiwan Intellectual Property Office for counterpart application No. 108117384.
English Abstract Translation of Foreign Reference CN 101266915.
US Patent Publication 20190224811 is the counterpart application to Foreign Reference TW 201922420.
Office Action and Search Report dated Jul. 3, 2020 issued by China National Intellectual Property Administration for counterpart application No. 201910505972.9.
English Abstract Translation for Foreign Reference CN103029035.
English Abstract Translation for Foreign Reference CN106808359.
English Abstract Translation for Foreign Reference JP2008307659.
US Patent Publication 20110138951 is the counterpart application to Foreign Reference CN 102418677 A.
US Patent Publication 20130237136 is the counterpart application to Foreign Reference CN 103222034 A.
US Patent Publication 20150343852 is the counterpart application to Foreign Reference CN 104903132 A.
US Patent Publication 20190224811 is the counterpart application to Foreign Reference CN 109794849 A.

* cited by examiner

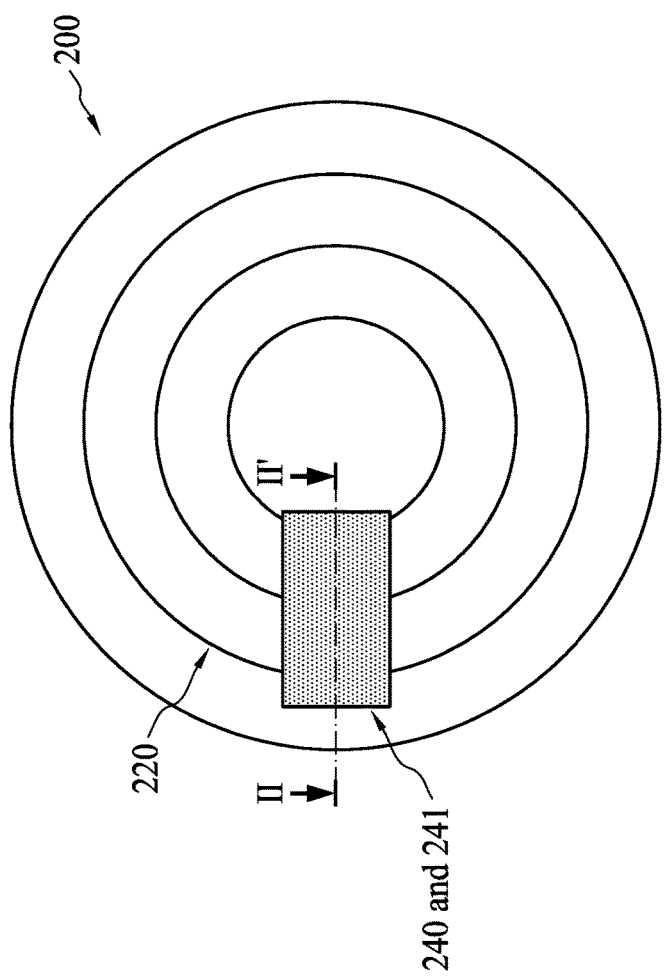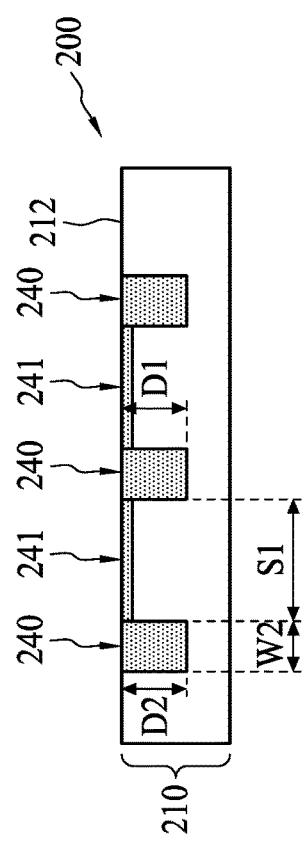
FIG. 6A
FIG. 6B

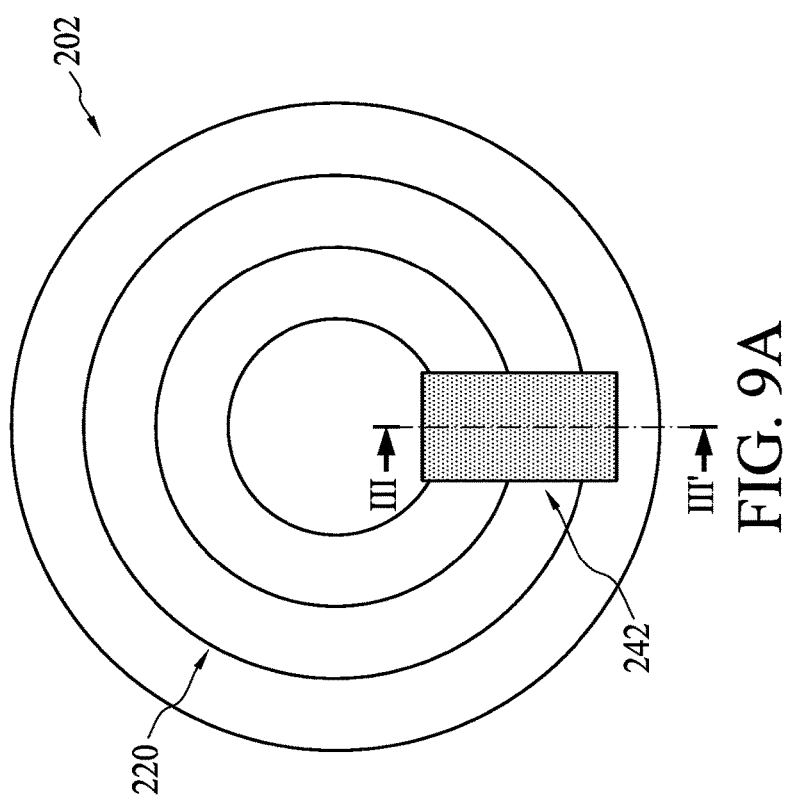
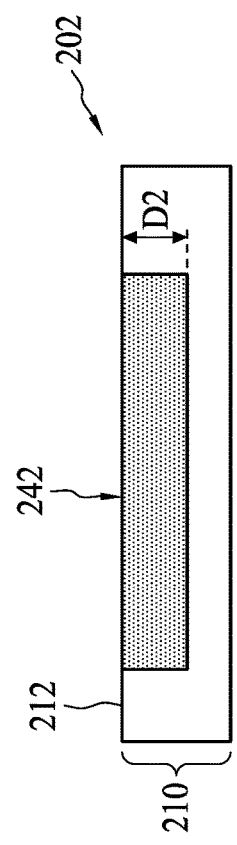

APPARATUS AND METHODS FOR CHEMICAL MECHANICAL POLISHING

PRIORITY DATA

This patent claims the benefit of U.S. Provisional Patent Application Ser. No. 62/711,021 filed Jul. 27, 2018, the entire disclosure of which is hereby incorporated by reference.

BACKGROUND

Chemical mechanical polishing (CMP) is widely used in the fabrication of integrated circuits. As an integrated circuit is built up layer by layer on a surface of a semiconductor wafer, CMP is used to planarize the topmost layer or layers to provide a level surface for subsequent fabrication operations. CMP is carried out by placing the semiconductor wafer in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical forces.

CMP can be used at a number of time points during the fabrication of an integrated circuit. For example, CMP may be used to planarize the inter-level dielectric layers that separate the various circuit layers in an integrated circuit. CMP is also commonly used in the formation of the conductive lines of interconnect components in an integrated circuit. By abrasively polishing the surface of the semiconductor wafer, excess material and surface roughness in layers can be removed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 6A is a schematic drawing illustrating a polishing pad according to aspects of the present disclosure in one or more embodiments.

FIG. 6B is a cross-sectional view taken along line II-II' of FIG. 6A.

FIGS. 7A, 8A and 9A are schematic drawings illustrating a polishing pad at various fabrication stages constructed according to aspects of the present disclosure in one or more embodiments.

FIGS. 7B, 8B and 9B are cross-sectional views taken along line III-III' of FIGS. 7A, 8A and 9A, respectively.

DETAILED DESCRIPTION

Figure 1:
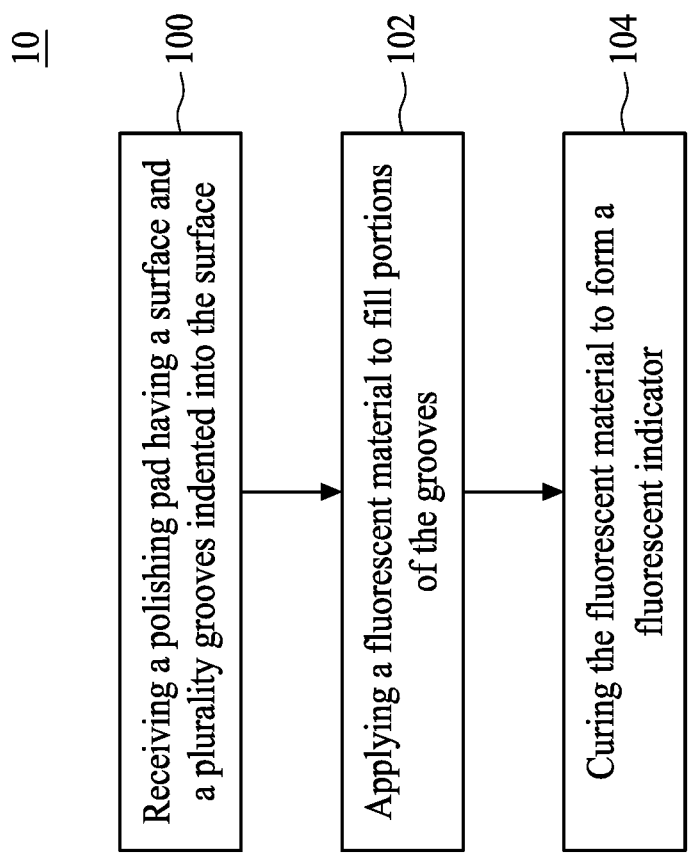
FIG. 1 is a flowchart representing a method for forming a fluorescent indicator on a polishing pad according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (for example, rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, "groove" is a structure recessed from a perimeter or an edge of another structure. Further, "groove", "recess" or "trench" can be interchangeably used in some embodiments in the present disclosure.

A polishing pad is an expensive consumable item used in a semiconductor wafer fabrication operation. It may be a hard, incompressible pad or a soft pad. For example, a hard and stiff pad can be used to achieve planarity for oxide polishing operation, and a softer pad can be used in other polishing operations to achieve improved uniformity and smoothness surface. The hard pad and the soft pad can even be combined in an arrangement of stacked pads for customized applications. The polishing pad is typically provided with grooves in its polishing surface for slurry distribution and improving pad-to-wafer contact, thus improving polishing efficiency. For example, the grooves increase the slurry carrying capacity of the polishing pad. Therefore different groove designs have been developed.

During a polishing operation, the polishing pad is consumed and depths of the grooves are reduced. Consequently, slurry distribution and polishing efficiency are adversely impacted when the grooves get shallow. Further, the polishing pad has to be replaced with a new one when the grooves are no longer observed.

However, conventional CMP techniques lack real-time feedback to adequately account for or report changes in the surface condition of the polishing pad. A polishing pad being replaced before the end of its useful lifetime increases manufacturing cost and waste. But an overly worn polishing pad, such as a polishing pad having grooves too shallow to distribute the slurry or no grooves to distribute the slurry, can cause wafers to be planarized more slowly and less uniformly. Therefore, it is imperative to monitor the surface condition of the polishing pad so they can be changed or replaced at an optimum time that strikes a good balance between maximizing the useful lifetime, maximizing wafer throughput, and maximizing wafer surface uniformity.

The present disclosure therefore provides a polishing pad including an indicator such that the surface condition of the polishing pad can be easily monitored, and an end of a useful lifetime of the polishing pad can be easily detected. The present disclosure also provides a method for monitoring the surface condition of the polishing pad by detecting the indicator. Therefore, the end of the useful lifetime of the polishing pad can be detected in time when the indicator is polished or consumed during the polishing. Accordingly, the useful lifetime of the polishing pad is maximized without impacting the wafer throughput and wafer surface uniformity.

FIG. 1 is a flowchart representing a method for forming a fluorescent indicator on a polishing pad 10 according to aspects of the present disclosure. The method 10 includes an operation 100, in which a polishing pad is received. The polishing pad includes a surface and a plurality of grooves indented into the surface. The method 10 further includes an operation 102, in which a fluorescent material is applied to fill portions of the grooves. The method 10 further includes an operation 104, in which the fluorescent material is cured to form a fluorescent indicator. The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

Figure 2:
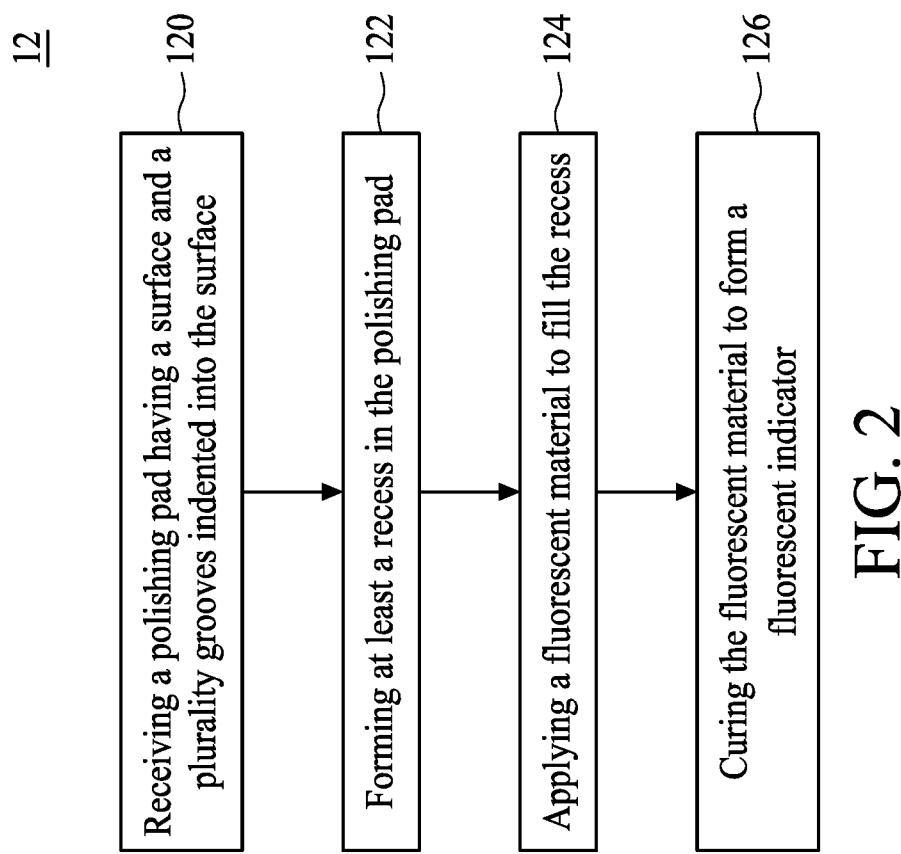
FIG. 2 is a flowchart representing a method for forming a fluorescent indicator on a polishing pad according to aspects of the present disclosure.

FIG. 2 is a flowchart representing a method for forming a fluorescent indicator on a polishing pad 12 according to aspects of the present disclosure. The method 12 includes an operation 120, in which a polishing pad is received. The polishing pad includes a surface and a plurality of grooves indented into the surface. The method 12 further includes an operation 122, in which at least a recess is formed in the polishing pad. The method 12 further includes an operation 124, in which a fluorescent material is applied to fill the recess. The method 12 further includes an operation 126, in which the fluorescent material is cured to form a fluorescent indicator. The method 12 will be further described according to one or more embodiments. It should be noted that the operations of the method 12 may be rearranged or otherwise modified within the scope of the various aspects. It should be further noted that additional processes may be provided before, during, and after the method 12, and that some other processes may be only briefly described herein. Thus, other implementations are possible within the scope of the various aspects described herein.

Figure 3A:
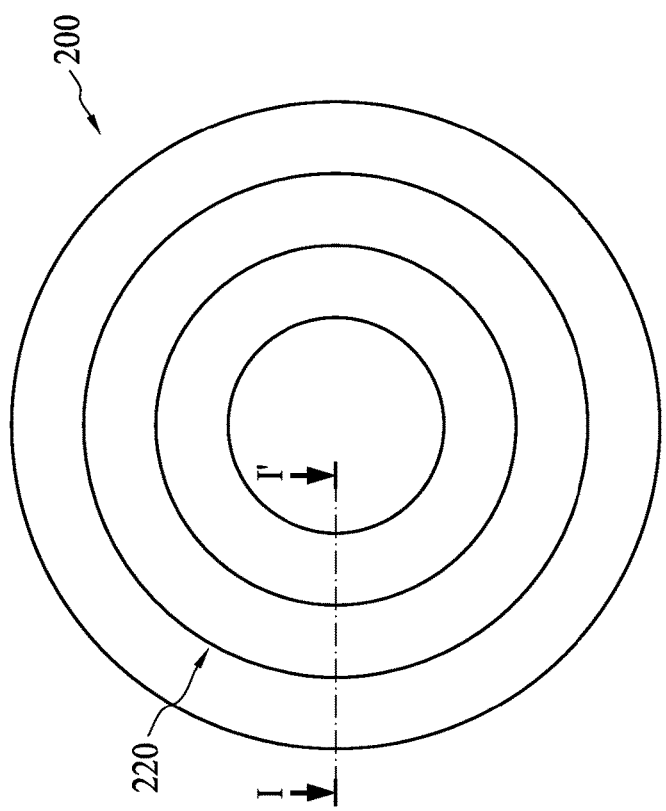
FIGS. 3A, 4A and 5A are schematic drawings illustrating a polishing pad at various fabrication stages constructed according to aspects of the present disclosure in one or more embodiments.
Figure 3B:
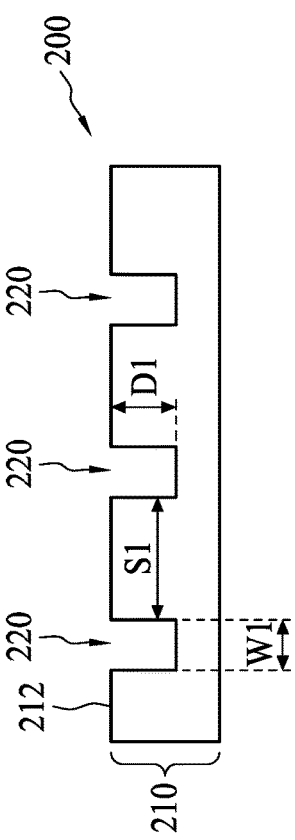
FIGS. 3B, 4B and 5B are cross-sectional views taken along line I-I' of FIGS. 3A, 4A and 5A, respectively.
Figure 4A:
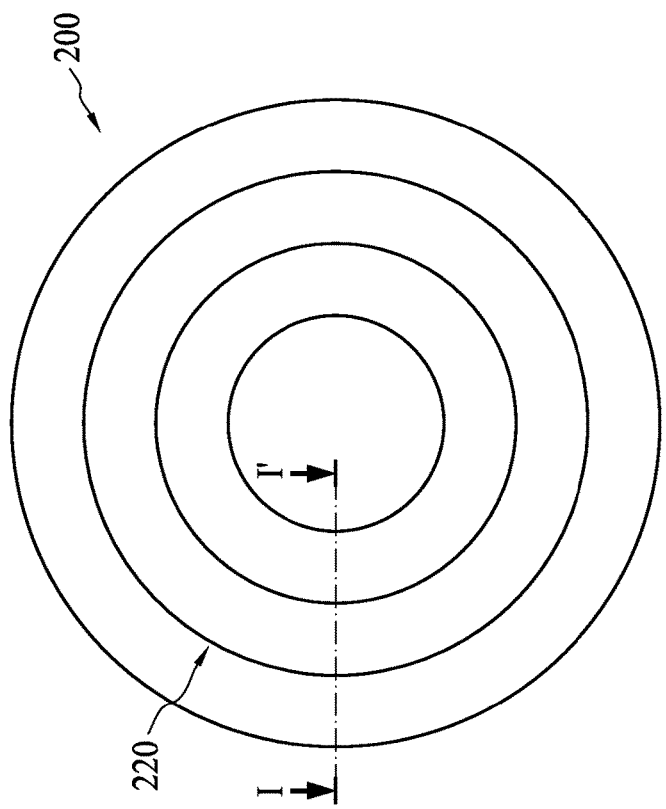
Figure 4B:
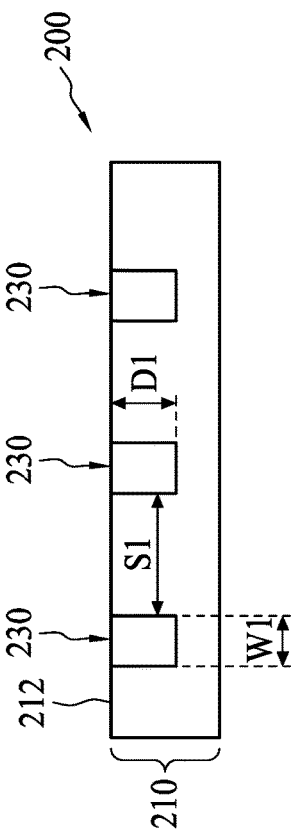
Figure 5A:
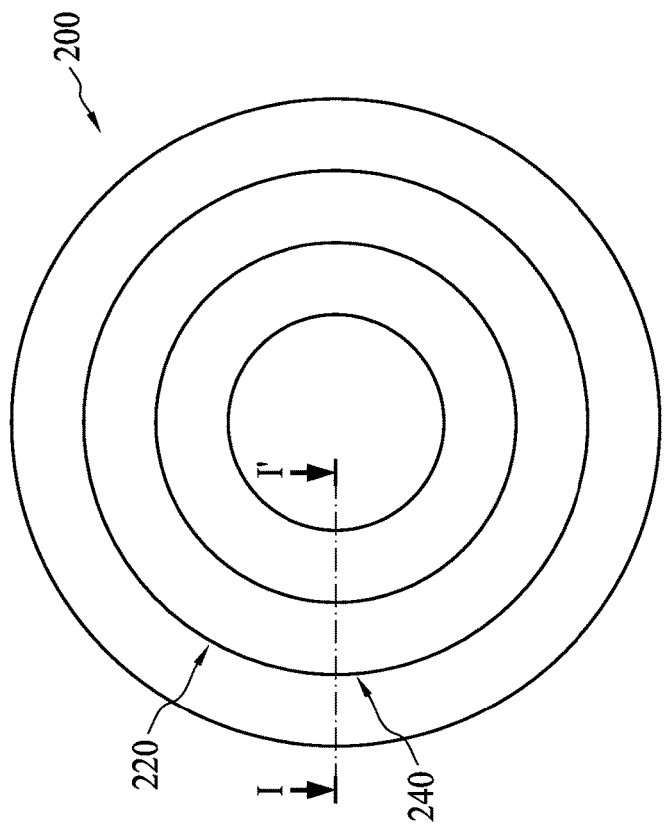

Please refer to FIGS. 3A, 4A and 5A, which are schematic drawings illustrating a polishing pad at various fabrication stages constructed according to aspects of the present disclosure in one or more embodiments. In addition, please refer to FIGS. 3B, 4B and 5B, which are cross-sectional views taken along line I-I' of FIGS. 3A, 4A and 5A, respectively. In some embodiments, a polishing pad 200 is received in operation 100 of the method 10. The polishing pad 200 includes a layer 210. In some embodiments, the layer 210 can include suitable polymeric materials such as, for example but not limited thereto, polyamides, polyimides, nylon polymer, polyurethane, polyester, polypropylene, polyethylene, polystyrene, polycarbonate, diene containing polymers, such as polyacrylonitrile ethylene styrene (AES), acrylic polymers, or combinations thereof. It should be noted that embodiments of the present disclosure also contemplate the use of organic or inorganic materials, or organic-inorganic hybrid materials that can be used as in exemplary polishing pads. In some embodiments, the polishing pad 200 can be a porous structure. In some embodiments, the polishing pad 200 can be a single-layered structure. In other embodiments, the polishing pad 200 can be a multi-layered structure. A surface 212 of the layer 210 is configured to polish an objective substrate or wafer during a polishing operation, therefore the surface 212 can be referred to as a polishing surface 212.

Referring to FIGS. 3A and 3B, in some embodiments, the polishing pad 200 includes a plurality of grooves 220 according to operation 100. The grooves 220 are indented into the surface 212 of the polishing pad 200 to improve slurry distribution and to hold the slurry to ensure that a sufficient amount of slurry is provided between the polishing pad 200 and the objective substrate or wafer during the polishing operation. In some embodiments, the grooves 220 are arranged to form a pattern of plural concentric circles, as shown in FIG. 3A, but the disclosure is not limited thereto. In some embodiments, the grooves 220 can be arranged to form a pattern of plural radial lines emanating from a center of the polishing pad 200. In some embodiments, the grooves 220 can be arranged to form a grid pattern. It should be noted that the grooves 220 can be arranged to form any symmetric or asymmetric patterns or combinations and can include any number of grooves in any pattern or combination of patterns.

Referring to FIGS. 3A and 3B, each groove 220 includes a depth D1. In some embodiments, the depth D1 of the grooves 220 is between approximately 0.1 mm and approximately 3.0 mm, but the disclosure is not limited thereto. Each of the grooves 220 includes a width W1, and the width W1 of the grooves is between approximately 0.1 mm and approximately 30 mm, but the disclosure is not limited thereto. Further, the grooves 220 are separated from each other by a spacing distance 51, and the spacing distance 51 is between approximately 0.1 mm and approximately 30 mm, but the disclosure is not limited thereto. It should be noted that the depth D1 of the grooves 220, the width W1 of the grooves 220 and the spacing distance 51 between the grooves 220 can vary in size as required for different polishing operations. Any suitable grooves configuration, width, depth, cross-sectional shape, or spacing distance can be employed in embodiments of the present disclosure to provide adequate slurry distribution over the polishing surface 212.

Referring to FIGS. 4A and 4B, a fluorescent material 230 is applied to fill portions of the grooves 220 according to operation 102 of the method 10. In some embodiments, the fluorescent material 230 is a glue-like material, and portions of the grooves 220 are filled with the fluorescent material 230, while other portions of the grooves 220 are free of the fluorescent material 230, as shown in FIGS. 4A and 4B. It should be noted that, although the fluorescent material 230 is applied to fill a portion of each groove 220 as shown in FIGS. 4A and 4B, the embodiment is not limited thereto. In some embodiments, the fluorescent material 230 is applied to fill a portion of several grooves 220, but other grooves 220 are free of the fluorescent material 230, though not shown. The fluorescent material 230 will be discussed in the following description.

Figure 5B:
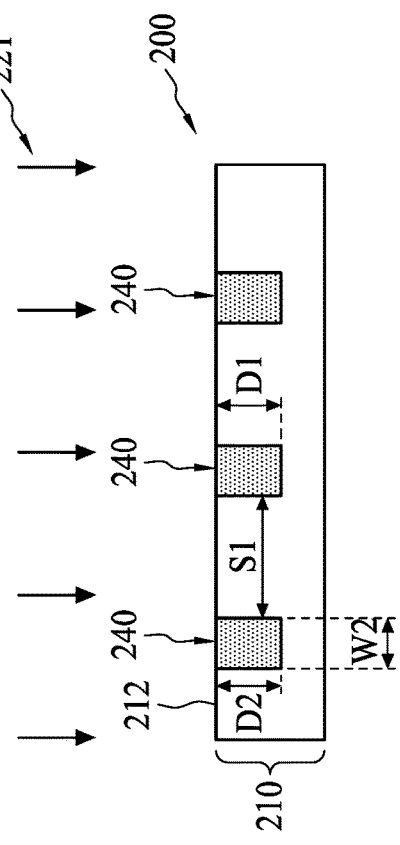

Referring to FIGS. 5A and 5B, the fluorescent material 230 is cured to form a fluorescent indicator 240 in the portions of the grooves 220 according to operation 104 of the method 10. In some embodiments, the fluorescent material 230 is cured by a UV curing operation. In some embodiments, the fluorescent material 230 is cured by a heat curing operation. Accordingly, a plurality of fluorescent indicators 240 is formed within the portions of the grooves 220, as shown in FIGS. 5A and 5B. In other words, the fluorescent indicators 240 are embedded in the layer 210 of the polishing pad 200. In some embodiments, each of the fluorescent indicators 240 includes a depth D2, and the depth D2 is equal to the depth D1 of the grooves 220. In other embodiments, the depth D2 of the fluorescent indicators 240 can be less than the depth D1 of the grooves 220. It should be understood that the depth D2 of the fluorescent indicators 240 should not be greater than the depth D1 of the grooves 220, because the fluorescent indicators 240 will remain on the polishing pad 200 even the grooves 220 are no longer observed and thus the surface condition monitoring will be failed. In some embodiments, a width W2 of the fluorescent indicators 240 is equal to the width W1 of the grooves 220. In some embodiments, the fluorescent indicators 240 are disposed within a portion of several grooves 220, but other grooves 220 are free of the fluorescent indicator 240, though not shown. In some embodiments, top surfaces of the fluorescent indicators 240 are coplanar or leveled with the polishing surface 212, as shown in FIG. 5B. In other embodiments, the top surfaces of the fluorescent indicators 240 can be lower than the polishing surface 212, though not shown.

Referring to FIGS. 6A and 6B, in some embodiments, the fluorescent material 230 can cover a portion of the polishing surface 212, and a fluorescent skin layer 241 can be formed to cover the portion of the polishing surface 212 after the curing, as shown in FIGS. 6A and 6B. In some embodiments, the fluorescent skin layer 241 is so thin that a top surface of the fluorescent skin layer 241 is flush with the polishing surface 212. For example but not limited thereto, a thickness of the fluorescent skin layer 241 is between approximately 1 μm and approximately 20 μm. In some embodiments, when the layer 210 includes softer material, the portion of the polishing surface 212 covered by the fluorescent skin layer 241 can be pressed down and thus the top surface of the fluorescent skin layer 241 is still flush with the rest of the polishing surface 212, as shown in FIG. 6B.

Accordingly, a polishing pad 200 is obtained. The polishing pad 200 includes the layer 210 having a polishing surface 212, the plurality of grooves 220 indented into the polishing surface 212 in the layer 210, and the fluorescent indicators 240 exposed through the polishing surface 212 and embedded in the layer 210. Each of the plurality of grooves 220 has the depth D1, each of the fluorescent indicators 240 has the depth D2, and the depth D2 of the fluorescent indicators 240 is equal to or less than the depth D1 of grooves 220. In some embodiments, the top surfaces of the fluorescent indicators 240 are substantially flush with the polishing surface 212, as shown in FIG. 5B. In some embodiments, the fluorescent skin layer 241 is formed to cover the portion of the polishing surface 212, as shown in FIG. 6B.

The layer 210 of the polishing pad 200 has a shore D hardness. In some embodiments, the shore D hardness of the layer 210 is in the range of 20-90, the disclosure is not limited thereto. In some embodiments, the shore D hardness greater than 90 causes scratching of the wafer, while the shore D hardness lesser than 20 causes low removal rate. In some embodiments, the fluorescent indicators 240 have a shore D hardness, and the shore D hardness of the fluorescent indicators 240 is equal to or less than the shore D hardness of the layer 210, such that the fluorescent indicators 240 cause less or no impact during the polishing operation. In some embodiment, the fluorescent indicators can optionally contain porosity that is introduced by a foaming process, in this situation the volume porosity of the fluorescent indicator 240 is less than 80% and more preferably less than 50%.

In some embodiments, the fluorescent indicators 240 (and the fluorescent skin layer 241 in some embodiments) include small molecule fluorescent material. In some embodiments, a molecular weight of the small molecule fluorescent material is less than 1000, but the disclosure is not limited thereto. In some embodiments, the fluorescent indicators 240 include fluorescein, anthracene, coumarin, acridine, thionin, rhodamine, pyrene, perylene, and their derivatives, but the disclosure is not limited thereto. In some embodiments, the fluorescent indicators 240 include a fluorescent polymer matrix of the small molecule fluorescent material and non-fluorescent polymer. For example, the small molecule fluorescent material can be blended with the non-fluorescent polymer form the fluorescent polymer matrix, but the disclosure is not limited thereto. In some embodiments, the non-fluorescent polymer can include polyamides, polyimides, nylon polymer, polyurethane, polyester, polypropylene, polyethylene, polystyrene, polycarbonate, diene containing polymers, such as AES, acrylic polymers, or combinations thereof, but the disclosure is not limited thereto. It should be noted that the non-fluorescent polymer in the fluorescent polymer matrix can be the same as that used to form the layer 210. For example, when the layer 210 includes polyurethane, the fluorescent polymer matrix can include the small molecule fluorescent material and polyurethane. Further, a concentration of the non-fluorescent polymer, such as polyurethane, in the fluorescent polymer matrix is greater than 30% by weight. In some embodiments, the concentration of polyurethane in the fluorescent polymer matrix can be greater than 60% by weight. In some embodiments, the concentration of polyurethane in the fluorescent polymer matrix can be greater than 90% by weight. It should be noted that with the higher concentration of polyurethane, the characteristic of the fluorescent indicators 240 are more like those of the layer 210. Accordingly, the fluorescent indicators 240 render minimum or no impact to the polishing operation.

In some embodiments, the fluorescent indicators 240 can include a fluorescent polymer matrix having fluorescent functional groups covalently attached to a polymer backbone or to a polymer side chain. In some embodiments, the fluorescent functional groups are covalently attached to a polymer backbone or to a polymer side chain via, for example but not limited thereto, ether, via ester, or C—C bonds as formula (1), formula (2) or formula (3):

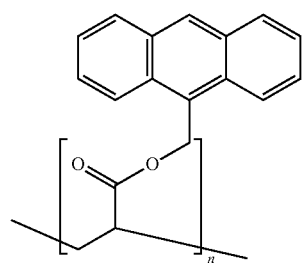

Formula (1)

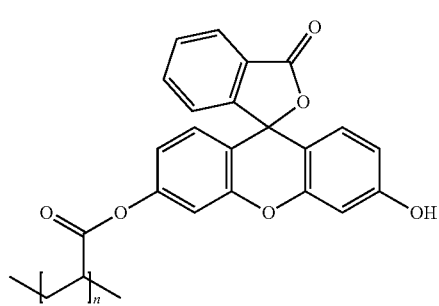

Formula (2)

Formula (3)

In some embodiments, the fluorescent indicators 240 generate fluorescence under UV light, and the fluorescence can be easily observed under UV light and detected by a fluorescent detector.

Figure 7A:
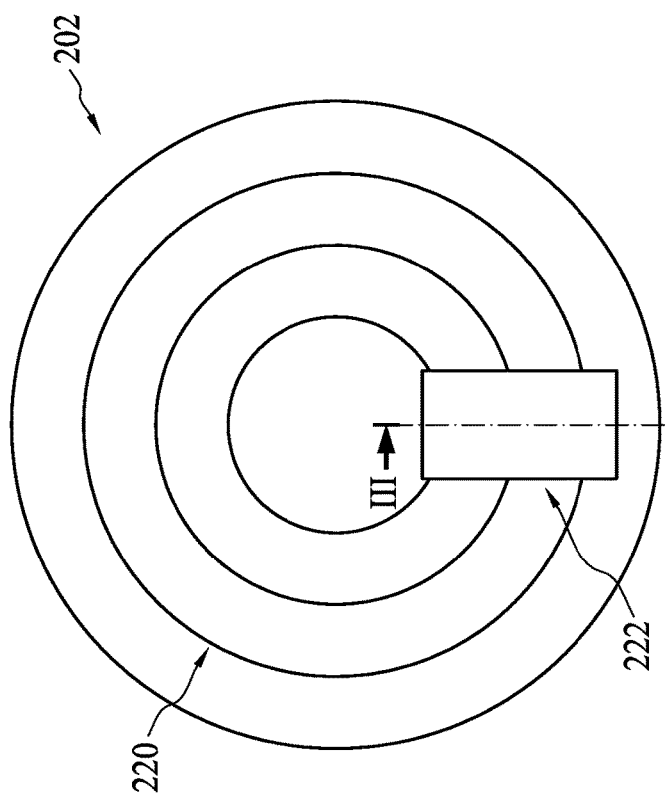
Figure 7B:
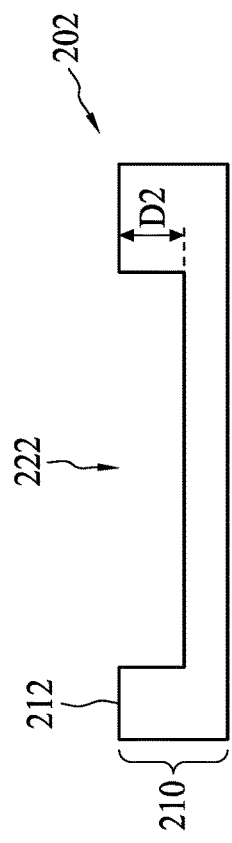
Figure 8A:
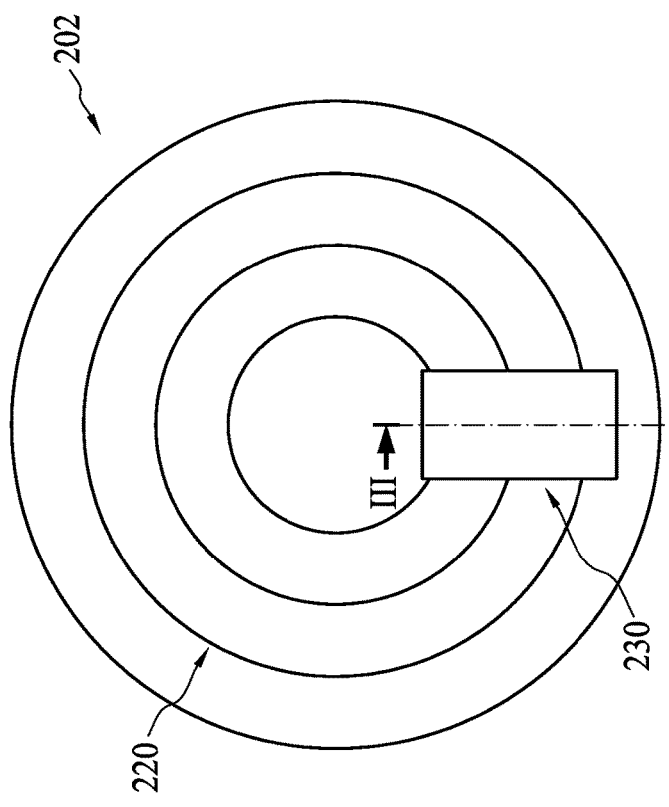

Please refer to FIGS. 7A, 8A and 9A, which are schematic drawings illustrating a polishing pad at various fabrication stages constructed according to aspects of the present disclosure in one or more embodiments. In addition, please refer to FIGS. 7B, 8B and 9B, which are cross-sectional views taken along line III-III' of FIGS. 7A, 8A and 9A, respectively. It should be noted that similar elements in FIGS. 4A to 6B and FIGS. 7A to 9B are designated by the same numerals. Further, similar elements in FIGS. 3A to 6B and FIGS. 7A to 9B can include the same materials; therefore such details are omitted in the interest of brevity. In some embodiments, a polishing pad 202 is received in operation 120 of the method 12. The polishing pad 202 includes a layer of material 210. Further, the polishing pad 202 includes a plurality of grooves 220 according to operation 120. The grooves 220 are used to improve slurry distribution and to hold the slurry to ensure that a sufficient amount of slurry is provided between the polishing pad 202 and an objective substrate or wafer during a polishing operation. As mentioned above, the grooves 220 can be arranged to form any symmetric or asymmetric patterns or combinations and can include any number of grooves in any pattern or combination patterns. As also mentioned above, each groove 220 includes a depth D1 and a width W1. Any suitable grooves configuration, width, depth, cross-sectional shape, or spacing distance can be employed in embodiments of the present disclosure to provide adequate slurry distribution over the polishing surface 212.

Still referring to FIGS. 7A and 7B, in some embodiments, a recess 222 is formed in the layer 210 of the polishing pad 202 according to operation 122 of the method 12. In some embodiments, the recess 222 can be formed by an etching operation. In some embodiments, the recess 222 can be formed using machining apparatus such as saws, mills, and lathes, but the disclosure is not limited thereto. The recess 222 includes a depth D2. In some embodiments, the depth D2 of the recess 222 can be equal to the depth D1 of the grooves 220. In other embodiments, the depth D2 of the recess 222 can be less than the depth D1 of the grooves 220, though not shown. In some embodiments, the recess 222 is coupled to at least one of the plurality of grooves 220, as shown in FIG. 6A, but the disclosure is not limited thereto.

Figure 8B:
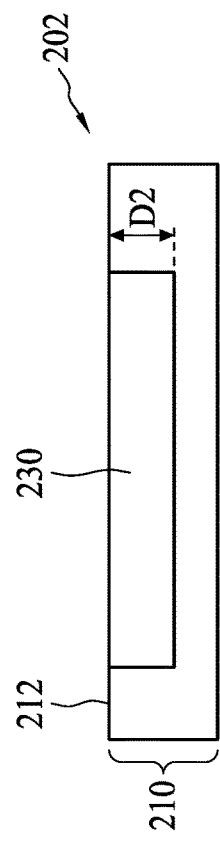

Referring to FIGS. 8A and 8B, a fluorescent material 230 is applied to fill the recess 222 according to operation 124 of the method 12. Referring to FIGS. 9A and 9B, the fluorescent material 230 is cured to form a fluorescent indicator 242 according to operation 126 of the method 12. As mentioned above, the curing operation can be a UV curing operation or a heat curing operation, but the disclosure is not limited thereto. In some embodiments, the fluorescent indicator 242 includes a depth D2, and the depth D2 is equal to or less than the depth D1 of the grooves 220. Further, in some embodiments, a top surface of the fluorescent indicator 242 is flush with the polishing surface 212, as shown in FIG. 9B. In some embodiments, the top surface of the fluorescent indicator 242 can be lower than the polishing surface 212, though not shown.

Accordingly, a polishing pad 202 is obtained. The difference between the polishing pad 200 and the polishing pad 202 is that the fluorescent indicator 240 in the polishing pad 200 is disposed in the portions of the grooves 220, while the fluorescent indicator 242 in the polishing pad 202 is disposed in the recess 222 in the layer 210. The fluorescent indicator 242 can be taken as a patch coupled to one or more grooves 220, as shown in FIG. 9B. As mentioned above, the fluorescent indicator 242 generates fluorescence under UV light, and the fluorescence can be easily observed under UV light and detected by a fluorescent detector. Since a surface area of the indicator 242 is greater than a surface area of the indicators 240, stronger fluorescent signal can be detected. In some embodiment, the fluorescent indicators 242 can optionally contain porosity that is introduced by a foaming process, in this situation the volume porosity of the fluorescent indicator 242 is less than 80% and more preferably less than 50%.

Figure 10A:
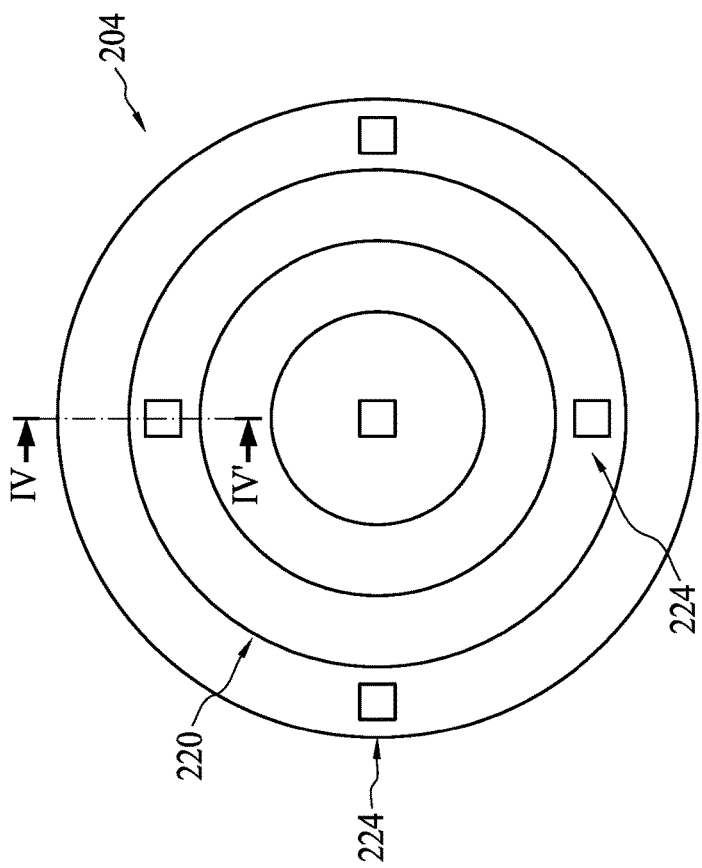
FIGS. 10A and 11A are schematic drawings illustrating a polishing pad at various fabrication stages constructed according to aspects of the present disclosure in one or more embodiments.
Figure 10B:
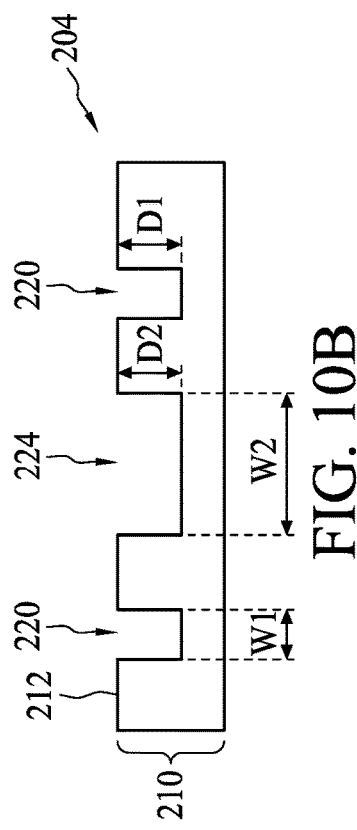
FIGS. 10B and 11B are cross-sectional views taken along line IV-IV' of FIGS. 10A and 11A, respectively.
Figure 11A:
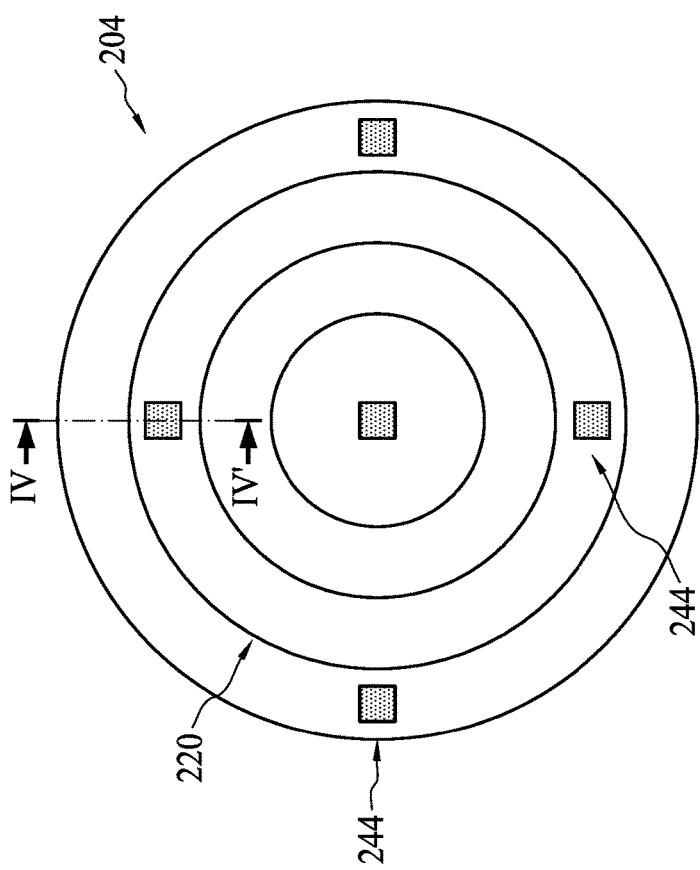

Please refer to FIGS. 10A and 11A, which are schematic drawings illustrating a polishing pad at various fabrication stages constructed according to aspects of the present disclosure in one or more embodiments. In addition, please refer to FIGS. 10B and 11B, which are cross-sectional views taken along line IV-IV' of FIGS. 10A and 11A, respectively. It should be noted that similar elements in FIGS. 3A to 6B and FIGS. 10A to 11B are designated by the same numerals. Further, similar elements in FIGS. 3A to 6B and FIGS. 10A to 11B can include the same materials; therefore those details are omitted in the interest of brevity. In some embodiments, a polishing pad 204 is received in operation 120 of the method 12. The polishing pad 204 includes a layer 210. Further, the polishing pad 204 includes a plurality of grooves 220 according to operation 120. In some embodiments, a recess 224 or a plurality of recesses 224 is formed in the layer 210 of the polishing pad 204 according to operation 122 of the method 12. In some embodiments, the recesses 224 can be formed by an etching operation. In some embodiments, the recess 224 can be formed using machining apparatus such as saws, mills, lathes or needle perforator, but the disclosure is not limited thereto. The recesses 224 include a depth D2. In some embodiments, the depth D2 of the recesses 224 can be equal to the depth D1 of the grooves 220. In other embodiments, the depth D2 of the recesses 224 can be less than the depth D1 of the grooves 220. In some embodiments, the recess 224 is separated from the grooves 220, as shown in FIGS. 10A and 10B, but the disclosure is not limited thereto. In addition, the recess area 224 can be of any geometric shape such as square or circular, or irregular, and the total recess area to total pad surface area ratio lies in the range of 0.0001% to about 50%.

Figure 11B:
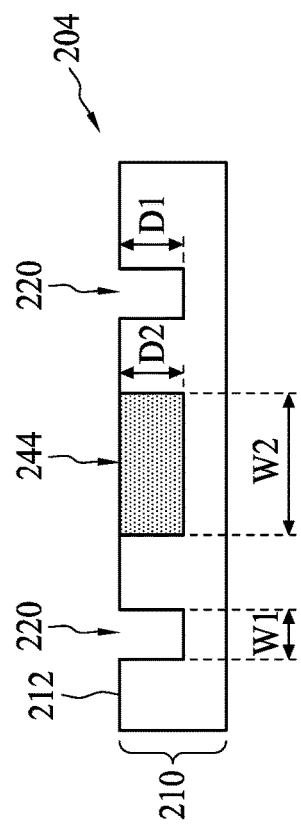

Next, a fluorescent material is applied to fill the recess 224 according to operation 124 of the method 12. Referring to FIGS. 11A and 11B, the fluorescent material is cured to form a fluorescent indicator 244 according to operation 126 of the method 12. As mentioned above, the curing operation can be a UV curing operation or a heat curing operation, but the disclosure is not limited thereto. Accordingly, at least a fluorescent indicator 244 is formed in the polishing pad 204, as shown in FIGS. 11A and 11B. In some embodiments, the fluorescent indicator 244 includes a depth D2, and the depth D2 is equal to or less than the depth D1 of the grooves 220. In some embodiments, a top surface of the fluorescent indicator 244 is flush with the polishing surface 212, as shown in FIG. 11B. In some embodiments, the top surface of the fluorescent indicator 244 is lower than the polishing surface 212, though not shown. Further, each of the fluorescent indicators 244 is separated from the plurality of grooves 220.

Accordingly, a polishing pad 204 is obtained. The difference between the polishing pad 200 and the polishing pad 204 is that the fluorescent indicator 240 in the polishing pad 200 is disposed in the portions of the grooves 220, while the fluorescent indicators 244 in the polishing pad 204 are separated from the grooves 220. As mentioned above, the fluorescent indicator 244 generates fluorescence under UV light, and the fluorescence can be easily observed under UV light and detected by a fluorescent detector camera. Since the fluorescent indicators 244 are separated from the grooves 220, the indicators 244 cause no impact to the slurry distribution. Further, by disposing the plurality of fluorescent indicators 244, more fluorescent signals can be detected. In some embodiments, the fluorescent indicators 244 can be disposed in the layer 210 of the polishing pad 204 randomly or periodically, and surface condition of the entire polishing surface 212 can be monitored.

Figure 12:
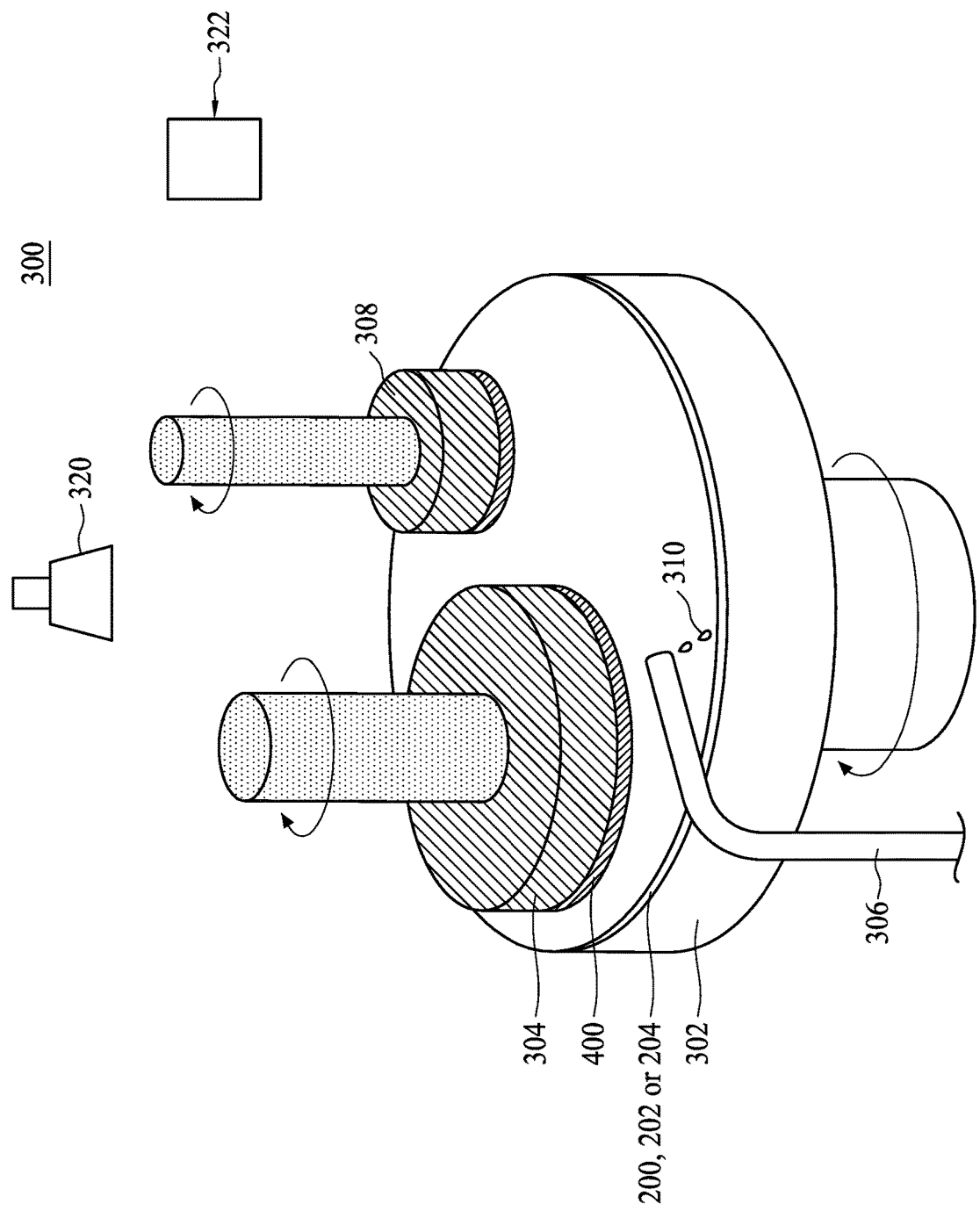
FIG. 12 is a perspective view of an apparatus for CMP in accordance with some embodiments.

Referring to FIG. 12, which is a perspective view of an apparatus for CMP 300. In accordance with some embodiments, the apparatus for CMP 300 includes a platen 302, the polishing pad 200, 202 or 204 provided on a top of the platen 302, a wafer carrier (sometimes referred to as a polishing head) 304, a slurry dispenser 306, and a conditioner 308.

In some embodiments, the platen 302 is configured to rotate in one or more directions. In some embodiments, the platen 302 is configured to be held stationary. In some embodiments, the platen 302 is configured to have a constant rotational speed. In alternative embodiments, the platen 302 is configured to have a variable rotational speed. The platen 302 can be rotated by a motor (not shown). In some embodiments, the motor can be an alternating current (AC) motor, a direct current (DC) motor, a universal motor, or another suitable motor. The platen 302 is configured to support the polishing pad 200, 202 or 204, as shown in FIG. 12.

The wafer carrier 304 is configured to support and retain a semiconductor wafer 400 proximate to the polishing surface 212 of the polishing pad 200, 202 or 204 during a polishing operation. In some embodiments, the wafer carrier 304 includes a retaining ring to secure the semiconductor wafer 400. In some embodiments, the wafer carrier 304 includes a vacuum to secure the semiconductor wafer 400. The wafer carrier 304 is configured to rotate in a direction the same as or different from the rotation direction of the platen 302. In some embodiments, the wafer carrier 304 is rotated in a direction opposite to the direction of the rotation of the platen 302. In some embodiments, the wafer carrier 304 is configured to have a constant rotational speed. In alternative embodiments, the wafer carrier 304 is configured to have a variable rotational speed. The wafer carrier 304 can be rotated by a motor (not shown). In some embodiments, the motor can be an AC motor, a DC motor, a universal motor, or another suitable motor. The wafer carrier 304 can be moved in a direction perpendicular to the polishing surface 212 of the polishing pad 200, 202 or 204 such that a pressure is exerted on the semiconductor wafer 400.

The slurry dispenser 306 is configured to dispense or deliver an abrasive slurry 310 onto the polishing surface 212 of the polishing pad 200, 202 or 204 to facilitate removal of materials from the semiconductor wafer 400. The slurry dispenser 306 can includes at least one nozzle (not shown) configured to dispense the abrasive slurry 310. The abrasive slurry 310 can include abrasive particles of special sizes and shapes, and can be suspended in an aqueous solution. The abrasive particles may be roughly as hard as the semiconductor wafer 400 that is to be polished. Acids or bases may be added to the aqueous solution, depending on the material to be polished. The abrasive slurry 310 may include other additives such as surfactants and/or buffer agents, but the disclosure is not limited thereto.

The conditioner 308 is configured to perform a conditioning which functions to scratch the polishing surface 212 or to remove portions of the polishing surface 212 that have accumulated too much polishing debris after the polishing process. In some embodiments, the conditioner 308 rotates for in-situ conditioning the polishing surface 212 during the polishing. In other words, the polishing surface 212 is revived by the conditioner 308 and thus a stable polishing operation is ensured.

The apparatus for CMP 300 further includes a UV light source 320 and a fluorescent detector 322. The UV light source 320 is configured to generate UV light, and the indictors 240, 242 or 244 in the polishing pad 200, 202 or 204 generate fluorescent light under UV light. The fluorescent detector 322 is configured to detect the fluorescent light. In some embodiments, the fluorescent light detected by the fluorescent detector 322 can be taken as a fluorescent signal.

In some embodiments, the semiconductor wafer 400 is held inside the wafer carrier 304 with upward suction applied to the wafer's backside. The platen 302 is rotated, and the polishing pad 200, 202 or 204 is correspondingly rotated. The abrasive slurry 310 is then dispensed onto the polishing surface 212. The wafer carrier 304 is then rotated and lowered toward the polishing pad 200, 202 or 204. When the rotation of the wafer carrier 304 reaches a wafer-polishing speed, the semiconductor wafer 400 is pressed to contact the polishing surface 212. This dual rotation, in the presence of the downward force applied to the semiconductor wafer 400 and the abrasive slurry 310, causes the semiconductor wafer 400 to be gradually planarized.

Figure 13:
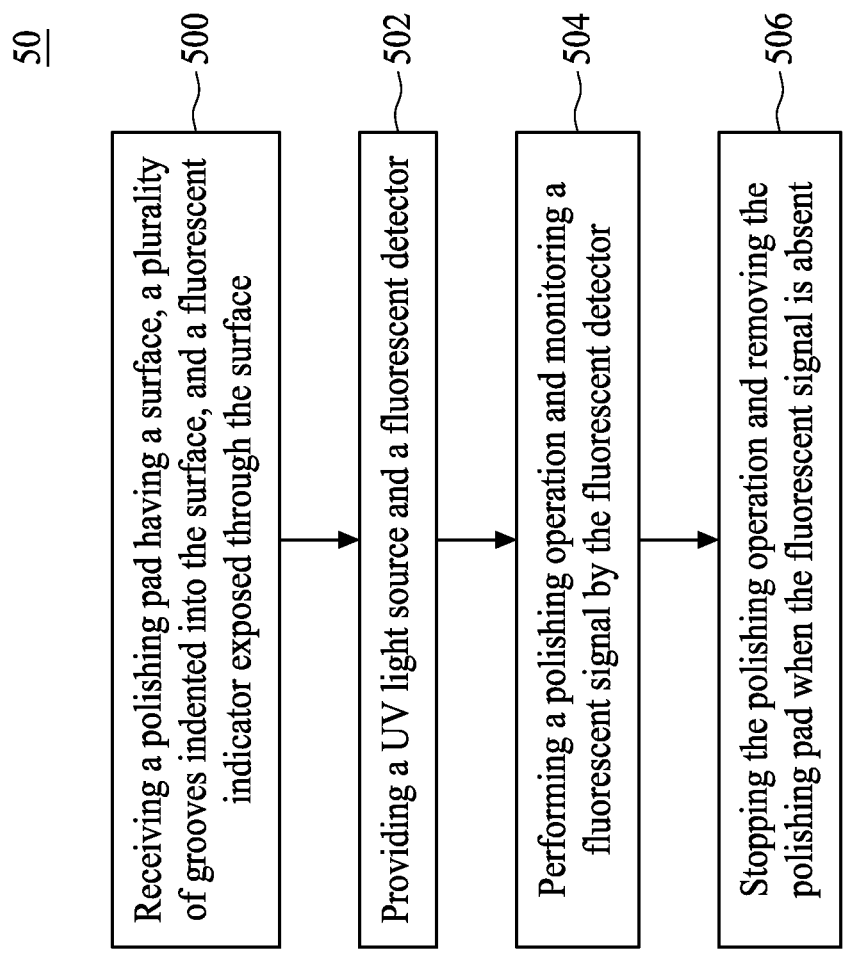
FIG. 13 is a flowchart representing a method for monitoring a polishing pad.

FIG. 13 is a flowchart representing a method for monitoring a polishing pad 50. The method 50 includes an operation 500, in which a polishing pad is received. The method 50 further includes an operation 502, in which an UV light source and a fluorescent detector are provided. The method 50 further includes an operation 504, in which a polishing operation is performed and a fluorescent signal is monitored by the fluorescent detector. The method 50 further includes an operation 506, in which the polishing operation is stopped and the polishing pad is removed when the fluorescent signal is absent.

Figure 14:
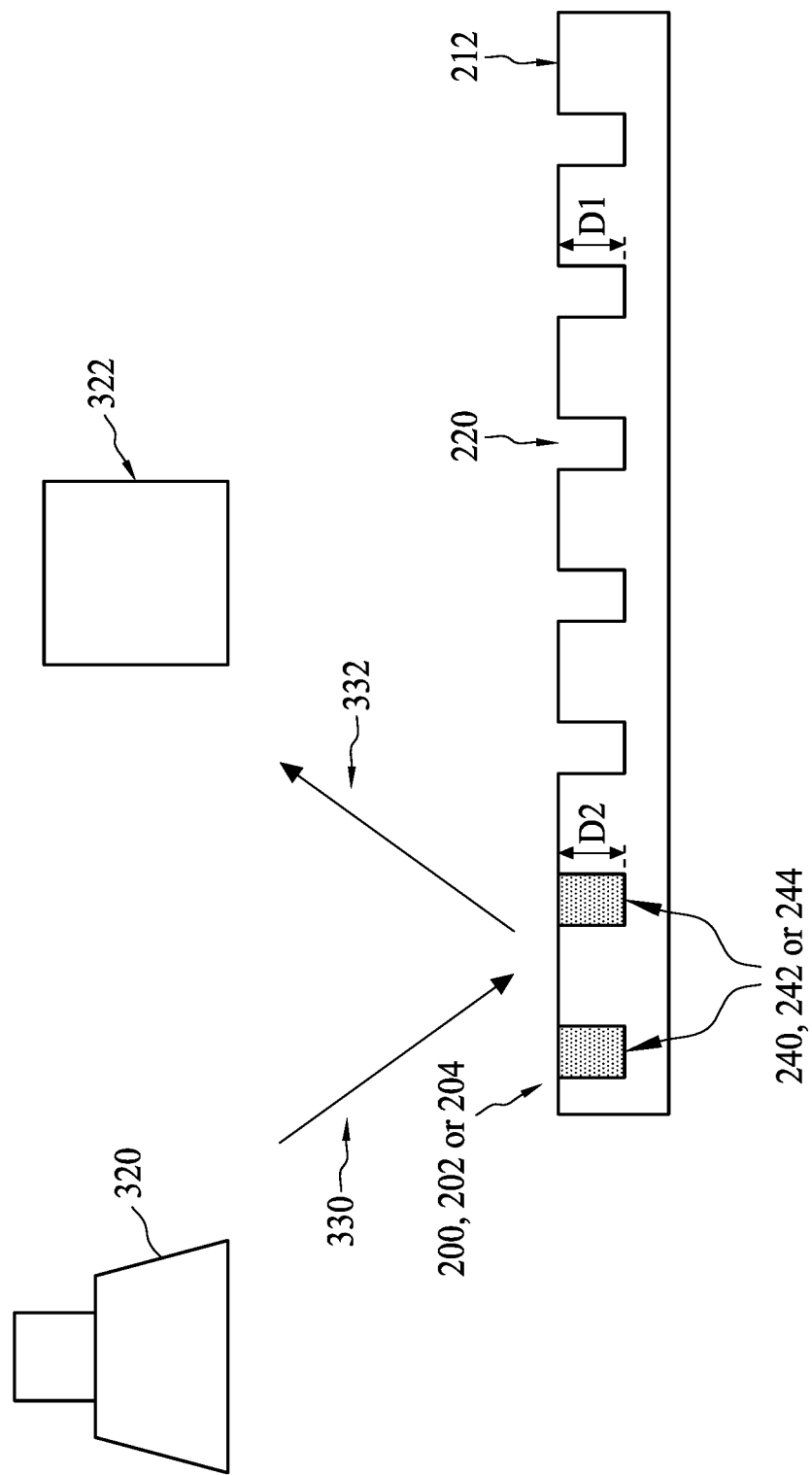
FIGS. 14 and 15 are schematic drawings illustrating a polishing pad at various stages in a polishing operation according to aspects of the present disclosure in one or more embodiments.

Referring to FIG. 14, in some embodiments, a polishing pad is provided in operation 500. The polishing pad can be the abovementioned polishing pad 200, 202 or 204. Therefore descriptions of the repetitive elements in the polishing pad 200, 202 or 024 are omitted in the interest of brevity. According to operation 502, the UV light source 320 and the fluorescent detector 322 are provided. In some embodiments, the fluorescent detector 322 is selected from photodiode, camera, and photomultiplier tube, but the disclosure is not limited thereto. As shown in FIG. 14, the UV light source 320 generates UV light 330, and the indicators 240, 242 or 244 in the polishing pad 200, 202 or 204 generate fluorescent light 332 under the UV light 330. Further, the fluorescent light 332 can be easily detected by the fluorescent detector 322 and taken as a fluorescent signal 322. According to operation 504, a polishing operation can be performed. In some embodiments, operation 502 and operation 504 can be performed simultaneously, but the disclosure is not limited thereto. Accordingly, the fluorescent signal 322 can be continuously monitored by the fluorescent detector 322 during the performing of the polishing.

As mentioned above, the polishing pad 200, 202 or 204 is conditioned by the conditioner 308 to restore the texture of the polishing surface 212. The layer 210 of the polishing pad 200, 202 or 204 is therefore consumed during the performing of the polishing operation. As the thickness of the polishing pad 200, 202 or 204 is reduced, the depth D1 of the grooves 220 and the depth D2 of the fluorescent indicators 240, 242 or 244 are also reduced. As a result, when the layer 210 of the polishing pad 200, 202 or 204 is sufficiently consumed, the grooves 220 may not be able to hold a sufficient amount of the abrasive slurry 310. In such case, the polishing operation may be adversely affected.

Figure 15:
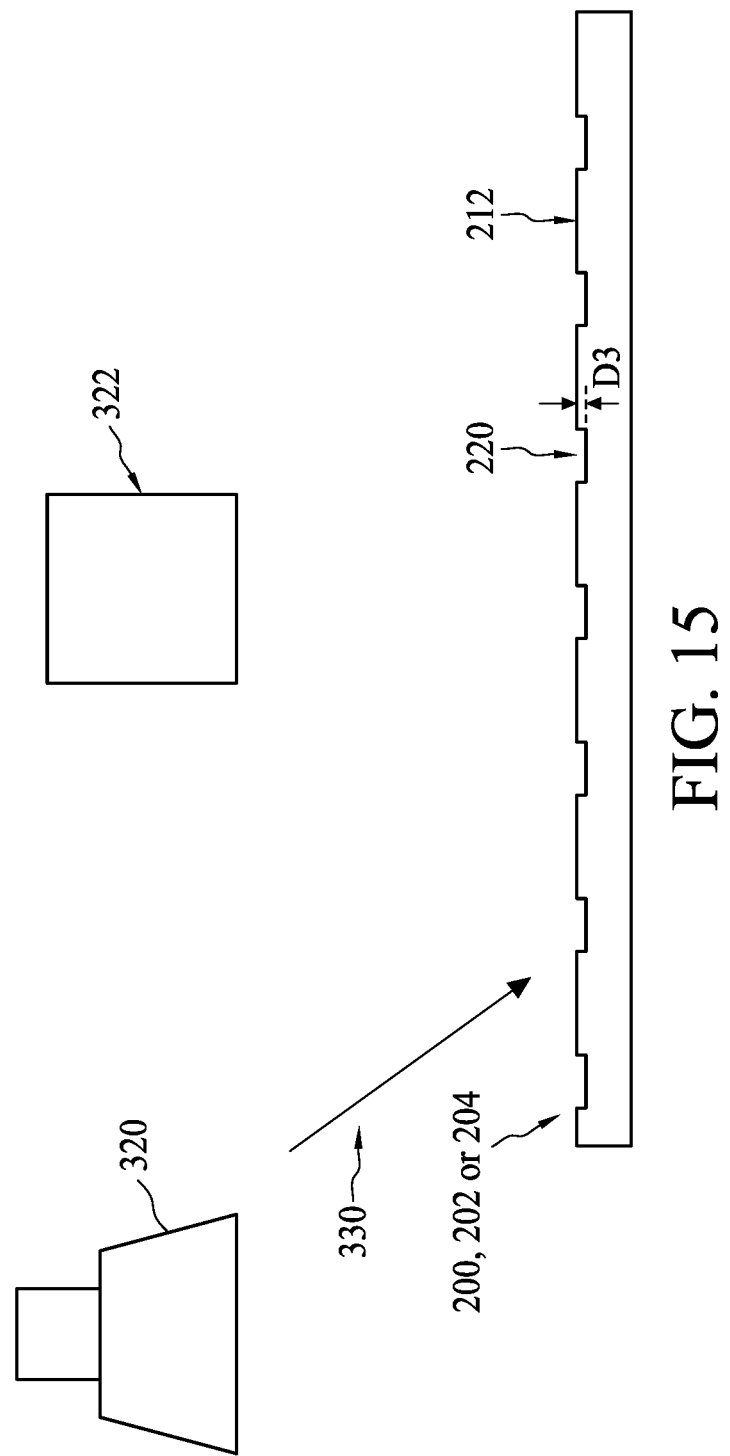

It should be noted that the depth D2 of the fluorescent indicator 240 is reduced as much as the reduction of the depth D1 of the grooves 220, as shown in FIG. 15. Therefore the fluorescent signal generated from the fluorescent indicator 240 may be weakened or diminished. In operation 506, when the fluorescent signal is too weak to be observed or when the fluorescent signal is absent, the polishing operation is stopped, and the polishing pad 200, 202 or 204 is removed from the platen 302. The grooves 220 have the depth D1 prior to the performing of the polishing operation. After the polishing pad 200, 202 or 204 is removed from the platen 302, a depth D3 of the grooves 220 may be able to be measured. In some embodiments, the depth D3 of the grooves 220 can be approximately 0% to approximately 75% of the depth D1 of the grooves 220, but the disclosure is not limited thereto. In some embodiments, the depth D3 of the grooves 220 can be approximately 0% to approximately 25% of the depth D1 of the grooves 220, but the disclosure is not limited thereto. Comparing the polishing pad 200, 202 or 204 shown in FIGS. 14 and 15, it can be observed that the depth D3 is less than the depth D1. In some embodiments, a difference between the depth D1 and the depth D3 is equal to a value indicating that the grooves 220 are too shallow to hold the sufficient amount of abrasive slurry. In some embodiments, the difference between the depth D1 and the depth D3 is equal to the depth D1. That is, the grooves 220 are no longer observed from the polishing pad 200, 202 or 204. In some embodiments, the polishing pad being removed from the platen 302 due to the absence of the fluorescent signal is referred to as a worn pad, and the worn pad can be replaced with a new polishing pad.

Accordingly, the surface condition of the polishing pad 200, 202 and 204 is continuously monitored, and the polishing operation can be stopped in time so that the worn pad can be replaced with a new one before the shallow grooves adversely affect the polishing operation. In other words, the end of the useful lifetime of the polishing pad 200, 202 and 204 can be accurately detected and the polishing efficiency of the polishing operation is ensured.

The present disclosure provides a polishing pad including an indicator such that the surface condition of the polishing pad can be easily monitored, and an end of useful lifetime of the polishing pad can be easily and accurately detected. The present disclosure also provides a method for monitoring the surface condition of the polishing pad by detecting the indicator. Therefore, the end of the useful lifetime of the polishing pad can be detected in time when the indicator is polished or consumed during the polishing. Accordingly, the useful lifetime of the polishing pad is maximized without impacting the wafer throughput and wafer surface uniformity.

In some embodiments, a polishing pad for CMP is provided. The polishing pad includes a layer having a surface configured to polish, a plurality of grooves indented into the polishing surface in the layer of material, and a fluorescent indicator in the layer of material. In some embodiments, each of the plurality of grooves has a first depth, the fluorescent indicator is located at a second depth, and the second depth is equal to or less than the first depth.

In some embodiments, a method for forming a fluorescent indicator in a polishing pad is provided. The method includes the following operations. A polishing pad is received. The polishing pad has a surface and a plurality of grooves indented into the surface. A fluorescent material is applied over the polishing pad. The fluorescent material is cured to form the fluorescent indicator embedded in the polishing pad.

In some embodiments, a method for monitoring a polishing pad is provided. The method includes the following operations. A polishing pad is received. The polishing pad has a surface, a plurality of grooves indented into the surface, and a fluorescent indicator exposed through the surface. A UV light source and a fluorescent detector are provided. A polishing operation is performed, and a fluorescent signal is monitored by the fluorescent detector. The polishing operation is stopped and the polishing pad is removed when the fluorescent signal is absent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polishing pad for chemical mechanical polishing (CMP) comprising:
   a layer having a surface configured to polish;
   a plurality of grooves indented into the surface of the layer;
   a fluorescent indicator embedded in the layer; and
   a fluorescent skin layer covering a portion of the surface of the layer,
   wherein each of the plurality of grooves has a first depth, the fluorescent indicator is located at a second depth, and the second depth is equal to or less than the first depth.

2. The polishing pad of claim 1, wherein a portion of the fluorescent indicator is disposed within a portion of the plurality of grooves.

3. The polishing pad of claim 1, wherein the fluorescent indicator is separated from the plurality of grooves.

4. The polishing pad of claim 1, wherein the fluorescent indicator covers a portion of the surface.

5. The polishing pad of claim 1, wherein a top surface of the fluorescent indicator is substantially leveled with the surface.

6. The polishing pad of claim 1, wherein the layer has a first shore D hardness, the fluorescent indicator has a second shore D hardness, and the second shore D hardness is equal to or less than the first shore D hardness.

7. The polishing pad of claim 1, wherein the fluorescent indicator comprises a small molecule fluorescent material.

8. The polishing pad of claim 7, wherein the fluorescent indicator comprises at least one of fluorescein, anthracene, coumarin, acridine, thionin, rhodamine, pyrene, perylene, and derivatives thereof.

9. The polishing pad of claim 7, wherein the fluorescent indicator comprises a fluorescent polymer matrix of the small molecule fluorescent material and a non-fluorescent polymer.

10. The polishing pad of claim 9, wherein a concentration of the non-fluorescent polymer in the fluorescent polymer matrix is greater than 30%.

11. The polishing pad of claim 1, wherein the fluorescent indicator comprises a fluorescent polymer matrix having fluorescent functional groups covalently attached to a polymer backbone or to a polymer side chain.

12. A method for forming a fluorescent indicator in a polishing pad, comprising:
    receiving a polishing pad having a surface and a plurality of grooves indented into the surface;
    applying a fluorescent material over the polishing pad; and
    curing the fluorescent material to form the fluorescent indicator embedded in the polishing pad and a fluorescent skin layer covering a portion of the surface of the polishing pad.

13. The method of claim 12, further comprising forming a recess in the polishing pad, wherein the fluorescent material is applied to fill the recess.

14. The method of claim 13, wherein each of the plurality of grooves has a first depth, the recess has a second depth, and the second depth is equal to or less than the first depth.

15. The method of claim 13, wherein the recess is coupled to at least one of the plurality of grooves.

16. The method of claim 13, wherein the recess is separated from the plurality of grooves.

17. A method for monitoring a polishing pad, comprising:
    receiving a polishing pad having a surface, a plurality of grooves indented into the surface, a fluorescent indicator exposed through the surface, and a fluorescent skin layer covering a portion of the surface of the polishing pad;
    providing a UV light source and a fluorescent detector;
    performing a polishing operation and monitoring a fluorescent signal by the fluorescent detector and the fluorescent skin layer; and
    stopping the polishing operation and removing the polishing pad when the fluorescent signal is absent.

18. The method of claim 17, wherein the plurality of grooves has a first depth before the performing of the polishing operation, a second depth when the fluorescent signal is absent, and the second depth is less than the first depth.

19. The method of claim 18, wherein a difference between the first depth and the second depth is equal to a value or to the first depth.

20. The method of claim 17, wherein the fluorescent detector is selected from a photodiode, a camera, and a photomultiplier tube.

* * * * *